United States Patent [19]

van der Plas et al.

[11] Patent Number: 4,906,595
[45] Date of Patent: Mar. 6, 1990

[54] METHOD OF MANUFACTURING A SEMICONDUCTOR DEVICE, IN WHICH A SILICON WAFER IS PROVIDED AT ITS SURFACE WITH FIELD OXIDE REGIONS

[75] Inventors: Paulus A. van der Plas; Wilhelmina C. E. Snels, both of Eindhoven, Netherlands

[73] Assignee: U.S. Philips Corporation, New York, N.Y.

[21] Appl. No.: 388,294

[22] Filed: Jul. 21, 1989

Related U.S. Application Data

[63] Continuation of Ser. No. 127,859, Dec. 2, 1987, abandoned.

[30] Foreign Application Priority Data

Dec. 8, 1986 [NL] Netherlands .................. 8603111

[51] Int. Cl.[4] .......................................... H01L 21/469
[52] U.S. Cl. .................................. 437/239; 437/238; 437/243; 437/244; 437/69; 427/255.3; 148/DIG. 117; 148/DIG. 118
[58] Field of Search ............... 437/69, 238, 239, 242, 437/243, 244; 427/255.1, 255.2, 255.3; 261/128; 148/DIG. 116, DIG. 117, DIG. 118

[56] References Cited

U.S. PATENT DOCUMENTS

| | | | |
|---|---|---|---|
| 2,930,722 | 3/1960 | Ligenza | 437/239 |
| 3,380,852 | 4/1968 | Goetzberger | 437/239 |
| 3,583,685 | 6/1971 | Boerger et al. | 261/128 |
| 4,139,658 | 2/1979 | Cohen et al. | 437/239 |
| 4,267,205 | 5/1981 | Pastor et al. | 437/239 |
| 4,363,868 | 12/1982 | Takasaki et al. | 437/239 |
| 4,376,796 | 3/1983 | Arrasmith et al. | 437/239 |
| 4,551,910 | 11/1985 | Patterson | 437/242 |
| 4,599,247 | 7/1986 | Bean et al. | 437/239 |

FOREIGN PATENT DOCUMENTS

| | | | |
|---|---|---|---|
| 0125966 | 9/1979 | Japan | 437/239 |
| 0062545 | 4/1982 | Japan | 437/239 |
| 0181540 | 10/1984 | Japan | 437/239 |
| 0122799 | 7/1985 | Japan | 437/239 |
| 0016531 | 1/1986 | Japan | 437/239 |
| 0010018 | 3/1987 | Japan | 437/239 |

OTHER PUBLICATIONS

Deal, "Thermal Oxidation Kinetics of Silicon in Pyrogenic $H_2O$ and 5% $HCl/H_2O$ Mixtures", J. Electrochem. Soc. vol. 135, No. 4, Apr. 1978, pp. 576–578.
Deal, "The Oxidation of Silicon in Dry Oxygen, Wet Oxygen, and Steam", J. Electrochem. Soc., vol. 110, No. 6, Jun. 1963, pp. 527–533.
Irene et al., "Silicon Oxidation Studies: The Role of $H_2O$", J. Electrochem. Soc., vol. 124, No. 11, 1977, pp. 1757–1760.
Deal et al., "Kinetics of the Thermal Oxidation of Silicon in $O_2/H_2O$ and $O_2/Cl_2$ Mixtures", J. Electrochem. Soc., vol. 125, No. 2, Feb. 1978, pp. 339–346.
Ligenza, "Oxidation of Silicon by High-Pressure Steam", J. Electrochem. Soc., vol. 109, No. 2, Feb. 1962, pp. 73–76.
Berman, "Process for Forming $SiO_2$", IBMTDB, vol. 15, No. 11, Apr. 1973, p. 3535.
Irene, "Preparing Thin ($\geq 1000$ Å) $SiO_2$ Films", IBMTDB, vol. 17, No. 10, pp 3094–3095, Mar. 1975.
Irene, "The Effects of Trace Amounts of Water on the Thermal Oxidation of Silicon in Oxygen", J. Electrochem. Soc., vol. 121, No. 12, Dec. 1974, pp. 1613–1616.
Su, "Low Temperature Silicon Processing Techniques for VLSIC Fabrication", Solid State Technology, Mar. 1981, pp. 72–82.
Katz et al., "Defect Formation During High Pressure, Low Temperature Steam Oxidation of Silicon", J. Electrochem. Soc., vol. 125, No. 10, 1978, pp. 1680–1683.
Ghandhi, *VLSI Fabrication Principles*, John Wiley and Sons, Inc., pp. 385–388, 1983.

Primary Examiner—Brian E. Hearn
Assistant Examiner—M. Wilczewski
Attorney, Agent, or Firm—Paul R. Miller

[57] ABSTRACT

A method of manufacturing a semiconductor device, in which a surface (1) of a silicon wafer (2) is locally provided with an oxidation mask (3), whereupon the wafer is subjected to an oxidation treatment by heating it in an oxidizing gas mixture. According to the invention, the wafer is heated during the treatment in the oxidizing gas mixture to a temperature of 950° to 1050° C. Water is then added to the oxidizing gas mixture. The quantity of added water is initially less than 30% by volume and later larger. Thus, in a comparatively short time a comparatively thick layer of oxide can be formed without defects being formed in silicon lying under the oxide.

12 Claims, 3 Drawing Sheets

METHOD OF MANUFACTURING A SEMICONDUCTOR DEVICE, IN WHICH A SILICON WAFER IS PROVIDED AT ITS SURFACE WITH FIELD OXIDE REGIONS

This is a continuation of application Ser. No. 127,859, filed Dec. 2, 1987, now abandoned.

The invention relates to a method of manufacturing a semiconductor device, in which a surface of a silicon wafer is locally provided with an oxidation mask, after which the wafer is subjected to an oxidation treatment by heating the wafer in an oxidizing gas mixture having a composition which is modified during the oxidation treatment.

Thus, the silicon wafer is provided at its surface with field oxide regions. These regions are particularly suitable for mutual insulation of MOS transistors in integrated semiconductor circuits.

BACKGROUND OF THE INVENTION

U.S. Pat. No. 4,551,910 discloses a method of the kind mentioned in the opening paragraph, in which the oxidation treatment is carried out initially under dry conditions and then under wet conditions. During the dry oxidation in a dry gas mixture containing hydrochloric acid, the wafer is heated to a temperature of 1000° C., while during the wet oxidation in steam it is heated to a temperature of 920° C. The dry oxidation is carried out until a layer of silicon oxide has formed having a thickness of about 50 nm, while the subsequent wet oxidation is carried out until the layer of silicon oxide has reached a desired thickness. As an oxidation mask a layer of silicon nitride is used, which is formed in part by thermal nitridation of the silicon and which is provided for the remaining part at a low pressure by deposition from the gaseous phase by means of an LPCVD process.

When, as described, the oxidation is initially carried out under dry conditions, the formation of defects in the silicon during the subsequent wet oxidation is counteracted. However, the known method has the disadvantage that it takes a comparatively long time to form a layer of oxide. In the manufacture of integrated circuits, this means either that the rate of passage of the wafers to be treated is low or that additional furnaces have to be arranged. For the formation of, for example, a layer of oxide having a thickness of 800 nm, a wafer would be treated for about 9 hours, about 1 hour of this treatment being a dry oxidation at 1000° C. and about 8 hours being a wet oxidation at 920° C. The time required to reduce the temperature in a furnace from 1000° C. to 920° C. then has not yet been taken into consideration.

SUMMARY OF THE INVENTION

The invention has inter alia for its object to provide a method by which in a comparatively short time a silicon wafer can be provided at its surface with field oxide regions, while the formation of defects in the silicon is counteracted.

According to the invention, the method mentioned in the opening paragraph is for this purpose characterized in that during the heat treatment in the oxidizing gas mixture the wafer is heated to a temperature of 950 to 1050° C. and in that water is then added to the oxidizing gas mixture in a quantity which is increased during the oxidation treatment from less than 30% by volume to more than 30% by volume. Thus, in a comparatively short time a layer of field oxide can be formed without defects being formed in the underlying silicon.

The invention is based on the recognition of the fact that, in order to avoid the formation of defects in the silicon during the oxidation, this oxidation must be carried out at a rate which does not exceed a critical value. Since the oxidation is effected in a gas mixture of a fixed composition and at a fixed temperature at a rate which becomes lower as the quantity of oxide formed increases, in other words at a rate which is a maximum at the beginning of the oxidation, it is of major importance that both the composition of the oxidizing gas mixture and the temperature at which the oxidation is carried out are determined carefully at the beginning of the oxidation. Experiments have shown that, when the oxidation temperature is not higher than 1050° C. and the gas mixture does not contain more than 30% by volume of water, the oxidation is initially effected at such a low rate that no defects are formed in the silicon. When the gas mixture then contains more than 30% by volume of water, defects are formed in the silicon during the oxidation, however. When the quantity of water in the gas mixture is increased to more than 30% by volume practically immediately after the beginning of the oxidation when, for example, about 100 nm oxide has formed, no defects are formed in the silicon. Under the given conditions, the critical rate is apparently not exceeded, while the oxidation process can nevertheless be carried out at a comparatively high rate.

A layer of oxide having a thickness already mentioned above of about 800 nm can be formed within 4 hours if the quantity of water in the oxidizing gas mixture is increased to more than 80% by volume.

Experiments have further shown that, if the oxidation is carried out at a temperature of less than 950° C. a lateral oxidation occurs under the edges of the oxidation mask, which is much larger than that occurring at 1000° C. If the oxidation is carried out at a temperature higher than 1050° C., an extreme lateral oxidation is also found to occur, which moreover has an undesired form.

During the oxidation treatment, the quantity of water in the gas mixture, which is increased during the oxidation, can be continuously modified. However, this requires comparatively expensive and complicated equipment. A very practical method according to the invention is characterized in that the heat treatment in the oxidizing gas mixture is carried out in two processing steps, where during the first processing step carried out in a gas mixture containing less than 30% by volume by water a layer of oxide having a thickness of 50 to 200 nm is formed, after which during the second processing step carried out in a gas mixture containing more than 80% by volume of water the oxidation is continued until a layer of oxide of the desired thickness has formed. Such a method carried out in two steps can be realized with comparatively simple means. When an oxide layer is thus formed having a thickness of 800 nm, the oxidation lasts about 4 hours, of which 0.3 hour in the first step in which about 50 nm oxide is formed and 3.7 hours in the second step in which the remaining oxide is formed.

BRIEF DESCRIPTION OF THE DRAWINGS

The invention will now be described, more fully by way of example, with reference to a drawing. In this drawing.

Figure 1:
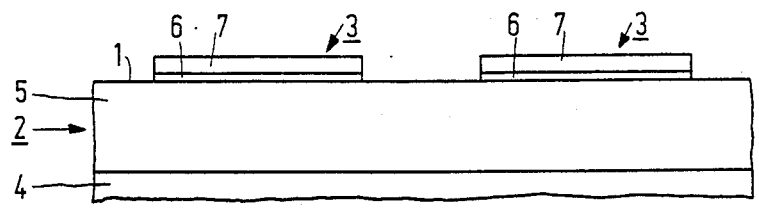
FIGS. 1 to 9 show in cross-section diagrammatically a few successive stages of manufacture of a semiconductor device by means of the method according to the invention.

The Figures are schematic and are not drawn to scale. The dimensions both in horizontal and in vertical direction are greatly exaggerated.

DESCRIPTION OF PREFERRED EMBODIMENT

FIGS. 1 to 9 show a number of successive stages of manufacture of a semiconductor device by means of the method according to the invention. An oxidation mask 3 is locally provided on a surface 1 of a silicon wafer 2. The silicon wafer 2 comprises a base layer 4 of the p-conductivity type having a doping concentration of about $10^{19}$ atoms per $cm_3$, on which a top layer 5, also of the p-conductivity type, but having a doping concentration of about $10^{15}$ atoms per $cm_3$ and a thickness of about 4 nm, is epitaxially deposited. The oxidation mask 3 comprises a strain-relieving base layer 6 and an oxidation-preventing top layer 7.

Subsequently, the silicon wafer 2 is subjected to an oxidation treatment in a usual oxidation furnace (not shown), in which the wafer 2 is heated in an oxidizing gas mixture. Field oxide regions 8 are then formed, which will serve as an electrical insulation between adjacent MOS transistors.

During the oxidation treatment, the composition of the oxidizing gas mixture is modified. According to the invention, the oxidation treatment is carried out in such a manner that during the heat treatment in the oxidizing gas mixture the wafer is heated to a temperature of 950° to 1050° C. and that water is then added to the oxidizing gas mixture in a quantity which is increased during the oxidation treatment from less than 30% by volume to more that 30% by volume. Besides after the gas mixture comprises, for example, oxygen and nitrogen. For the method according to the invention, the quantity of water is important because this is determinative of the rate at which the oxidation will be effected.

The water can be added to the gas mixture by passing this mixture through a vessel containing water. In the method according to the invention, the quantity of water in the gas mixture has to be modified. This can be effected in a more accurately controlled manner by adding water to the gas mixture in the form of hydrogen and oxygen, which gases are caused to react with each other in the oxidation furnace and then form water. Oxygen is added in an excess quantity to the gas mixture in order to avoid explosions from occurring in the furnace. The quantity of water present in the gas mixture which in the oxidation furnace contacts the silicon wafer can be determined in a simple manner by the composition of the gas mixture supplied to the oxidation furnace.

By means of the method according to the invention a layer of field oxide can be formed in a comparatively short time without defects being formed in the underlying silicon. In order to avoid that defects are formed in the silicon during oxidation, the oxidation should be carried out at a rate which does not exceed a critical value. Since the oxidation is effected at a fixed temperature and in a gas mixture of a fixed composition at a rate which is a maximum at the beginning of the oxidation and then decreases, special attention should be paid to the rate at the beginning of the oxidation. The oxidation rate is higher as the quantity of water in the gas mixture is larger. It has been found that, if at the beginning of the oxidation the oxidizing gas mixture contains at 1000° C. more than 30% by volume of water, defects are formed in the silicon; but if the oxidizing gas mixture contains less than 30% by volume this is not the case. Practically immediately after the beginning of the oxidation when, for example, only 100 nm of oxide has formed, the quantity of water in the oxidizing gas mixture can be increased to more than 30% by volume without the formation of defects in the silicon being promoted. The critical rate is then apparently not exceeded. Preferably, the quantity of water in the oxidizing gas mixture is increased to more than 80% by volume. Also in this case, no defects are formed in the silicon, while the oxidation is effected at a very high rate.

Figure 2:
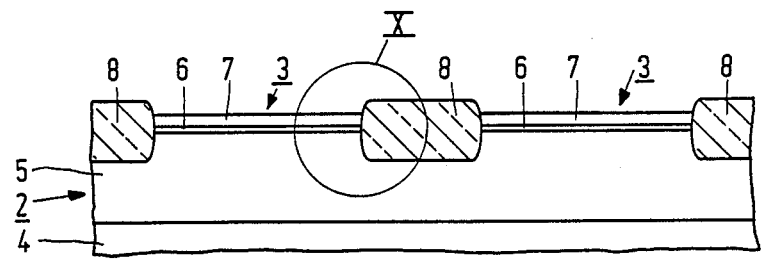
Figure 3:
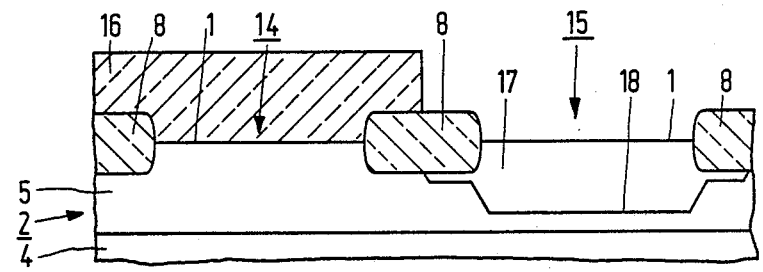
Figure 4:
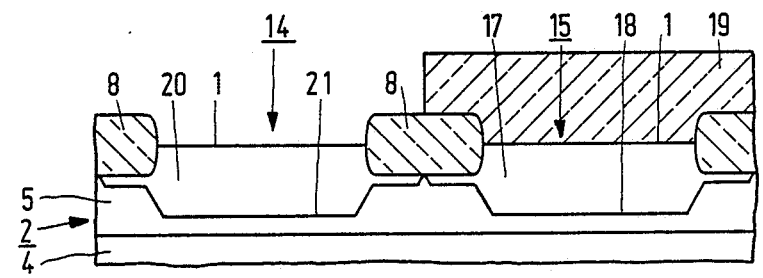
Figure 5:
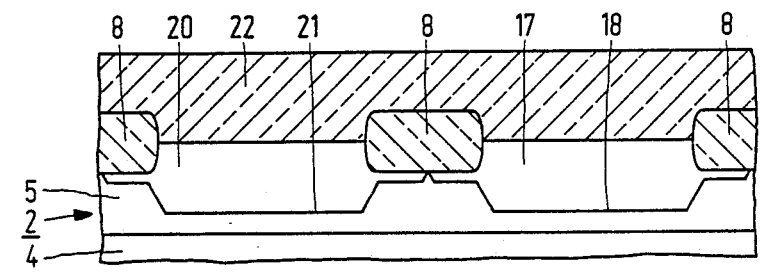
Figure 6:
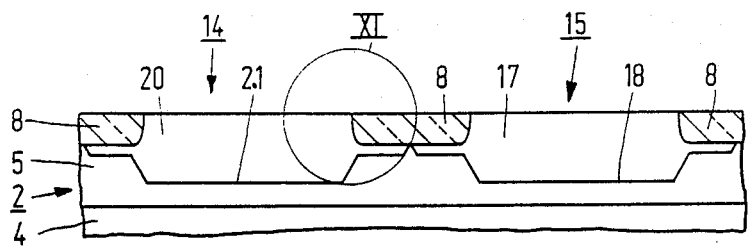
Figure 7:
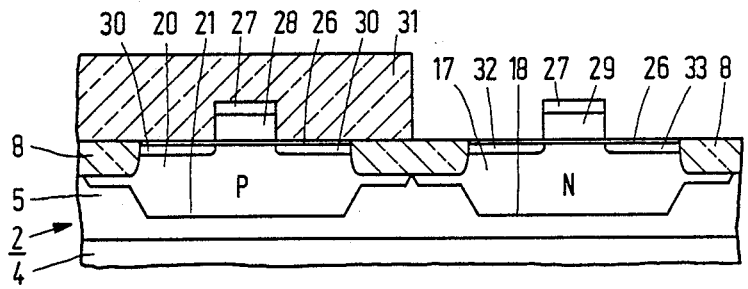
Figure 8:
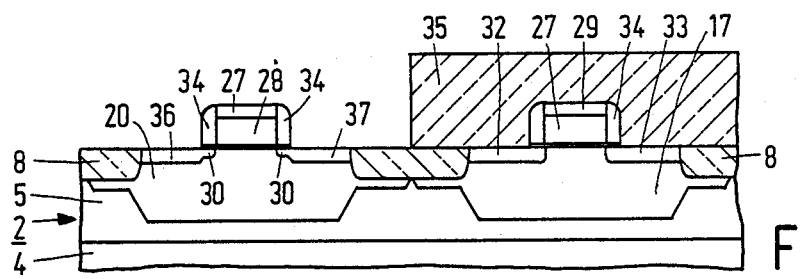
Figure 9:
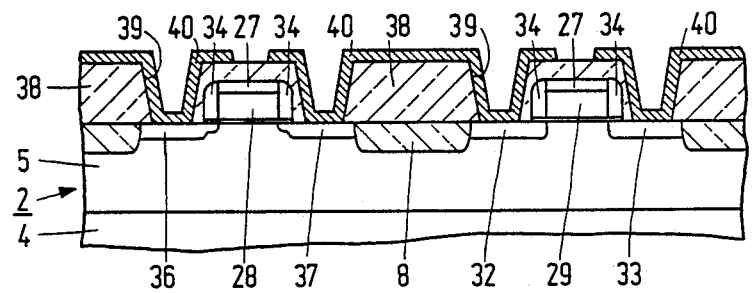
Figure 10:
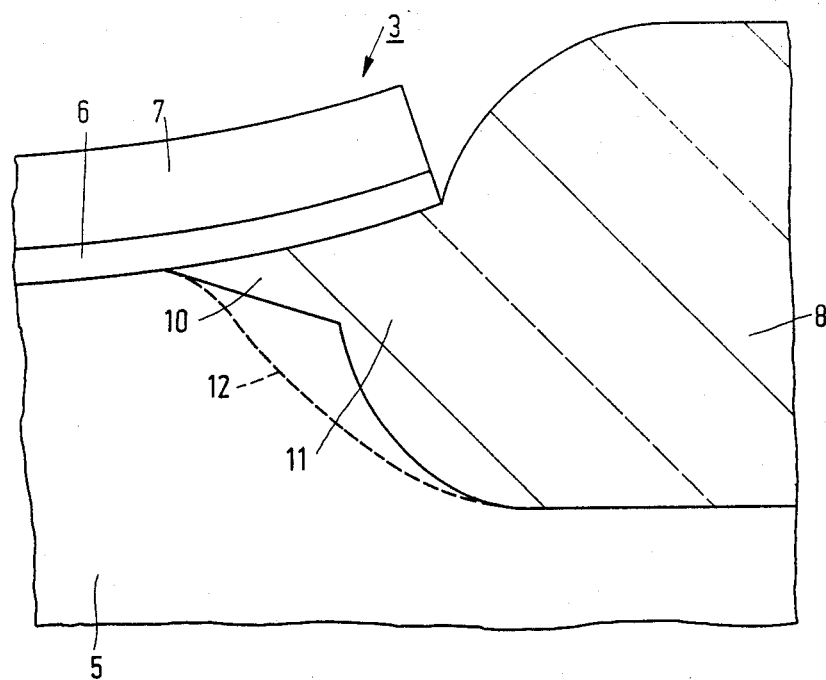
FIGS. 10 and 11 show a few details of the cross-sections shown in FIGS. 1 to 9.

The part X encircled in FIG. 2 is shown diagrammatically on an enlarged scale in FIG. 10.

During the oxidation treatment, a part of the silicon located below the oxidation mask 3 is also oxidized. The oxide formed by this lateral oxidation can be distinguished by a comparatively thin part 10 and a comparatively thick part 11. It has been found that, if the oxidation is carried out at a temperature of less than 950° C., the comparatively thin part 10 of the oxide becomes very long. If, when the field oxide 8 having a thickness of 800 nm has formed at a temperature of 1000° C., this part 10 still has a length of 300 nm, but this part 10 has a length of more than 600 nm if the oxidation treatment is carried out at 900° C. This is of course undesirable, more particularly in the manufacture of MOS transistors of dimensions in the submicron range. If the oxidation treatment is carried out at a temperature which is higher than 1050° C., the thick part 11 of the oxide obtains undesired dimensions. The oxide then assumes the profile indicated diagrammatically by a dotted line 12. As will appear from the following, this has also great disadvantages for the formation of MOS transistors having dimensions in the submicron range.

The quantity of water in the oxidizing gas mixture can be increased continuously from the beginning of the oxidation. In a very practical, simple and inexpensive embodiment of the method according to the invention, the heat treatment in the oxidizing gas mixture is carried out in two processing steps, where during the first processing step carried out in a gas mixture containing less than 30% by volume by water, the layer of oxide is formed with a thickness of 50 to 200 nm. During the second processing step the oxidation is then continued in a gas mixture containing more than 80% by volume of water until a layer of oxide is formed having a described thickness.

The oxidation treatment is then carried out, for example, in such a manner that the wafer is slipped into a furnace of 850° C., whereupon, while nitrogen is passed to the furnace, the silicon wafer is heated in about 20 minutes from 850° C. to a temperature of 1000° C. Subsequently, at 1000° C. a gas mixture is passed to the furnace with 6000 scc of nitrogen, 1125 scc of hydrogen and 1050 scc of oxygen per minute. In the furnace 1125 scc of water vapour is then formed in this gas mixture by combustion of the whole quantity of hydrogen, which means that the gas mixture contains about 15% by volume of water. This first processing step of the actual oxidation treatment is carried out for 20 minutes, after which also at a temperature of 1000° C. a gas mixture is passed to the oxydation furnace with 6600 scc of hydrogen and 4200 scc of oxygen per minute. In the furnace 6600 scc of water vapour is formed in this gas mixture, which means that the gas mixture contains about 88% by volume of water. This second processing step of the oxidation treatment is carried out for 3 hours and 40 minutes. After termination of the oxidation treatment, while nitrogen is passed to the furnace, the temperature of this furnace is decreased again in about 30 minutes to 850° C., after which the wafer is removed from the furnace. During the first processing step, about 50 nm of oxide is formed, while during the second processing step about 750 nm of oxide is formed. About 800 nm of oxide in all is consequently formed in 4 hours. Defects could not be found in the underlying oxide after the oxide was removed and a conventional etching treatment was carried out for indicating defects.

Preferably, during the oxidation treatment an oxidation mask 3 is used comprising a base layer 6 of silicon oxynitride having a refractive index of 1.6 to 1.8 and a top layer 7 of silicon nitride. Thus, it is achieved that the aforementioned lateral oxidation is comparatively small. The thin part 10 thereof was only 300 nm long when the layer of silicon oxynitride 6 had a thickness of 40 nm and the layer of silicon nitride 7 had a thickness of 100 nm, while the layer of oxide 8 was 800 nm. In this case, the thick part 11 was about 90 nm.

Preferably, a base layer of silicon oxynitride 6 having a thickness of 30 to 50 nm and a top layer of silicon nitride 7 having a thickness of 75 to 150 nm are used. If the layer of silicon nitride 7 is thicker than 150 nm, defects are formed in the silicon with the oxidation treatment described; if this layer is thinner than 150 nm, this is not the case. If the two layers 6 and 7 are too thin (thinner than 30 nm and 75 nm, respectively), the thin part 10 of oxide becomes longer than 300 nm with an oxide layer 8 having a thickness of 800 nm.

After the field oxide regions 8 have been formed in the manner described, the remaining oxidation-preventing mask 3 is removed. Thus, parts of the epitaxial top layer 5 enclosed by the field oxide regions 8 are exposed, of which two regions 14 and 15 are shown in the Figures by way of example. The method, limited to these regions 14 and 15, is further described hereinafter, it being noted that a very large number of regions similar to the regions 14 and 15 will be present in the semiconductor device.

The region 14 of the epitaxial top layer 5 is covered by a photoresist mask 16, which extends as far as above the field oxide 8 adjoining the region. By implantation of phosphorous ions at a dose of $10^{12}$ ions per cm$^2$ and an energy of 800 keV, a zone 17 of the n-conductivity type is formed in the region 15, which has a maximum doping indicated diagrammatically by a line 18, which is located in the region 5 at a depth of about 800 nm and just adjoins the field oxide 8 at the area of the adjoining field oxide. Since the maximum doping of the zone 17 is located not at the surface 1 of the silicon 5, but at a certain distance therefrom, while the doping at the surface 1 is smaller, the zone 17, also designated as a retrograde well, in this case becomes an n-type well in connection with the type of doping.

Subsequently, in a similar manner a p-retrograde well 20 having a maximum doping indicated by a line 21 also located at a depth of about 800 nm below the surface is formd in the region 14 by means of a photoresist mask 19 covering the region 15 and an implantation with B ions at a dose of $10^{12}$ ions per cm$^2$ and an energy of 350 keV.

Figure 11:
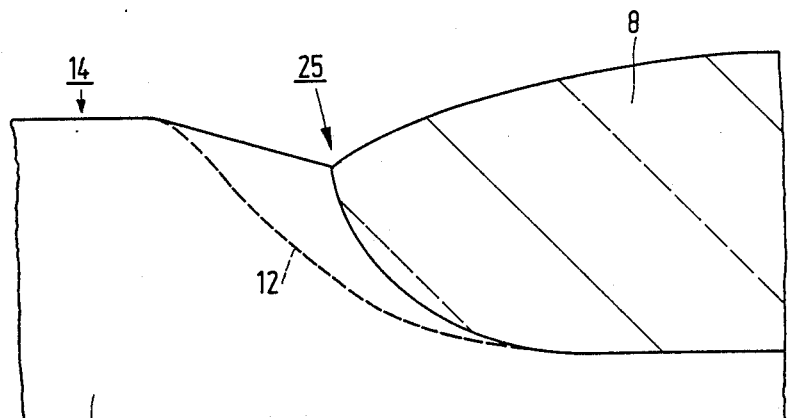

Now a thick planarizing photoresist layer 22 is provided, after which the whole wafer 2 is subjected to an etching treatment, in which the photoresist layer 22 and the silicon oxide are etched substantially at the same rate. This etching treatment is terminated when the flat structure shown in FIG. 6 and in an enlarged scale in FIG. 11 is obtained. As appears from FIG. 11, not only has the structure become flatter, but the thin part 10 of the oxide is also removed. As a result, the oxide 8 has a much more abrupt boundary 25 with the silicon 20 than before the etching treatment. Thus, the region 14 is defined more accurately. This would not be the case if the oxide should have the profile indicated by the dotted line 12. A more accurate definition of the region 14 is then not realized by the etching treatment.

After a thin gate oxide layer 26 having a thickness of about 20 nm has been provided - by heating the wafer for 30 minutes in dry oxygen -, gate electrodes 28 and 29 covered with an oxide layer 27 are provided in a usual manner. Subsequently, an implantation with phosphorous ions is carried out at an energy of 50 keV and a dose of $10^{13}$ ions per cm$^2$, in which lightly doped zones 30 are formed. Although they are indicated only in the p retrograde well 20, they are also provided in the n retrograde well, but in the latter case they are overdoped after having been provided with the aid of a photoresist mask 31 with boron ions by an implantation with BF ions having an energy of 55 keV and a dose of $2 \times 10^{15}$ ions per cm$^2$. Thus, the source zone 32 and the drain zone 33 are formed in the n retrograde well 17.

After the photoresist 31 has been removed, the whole wafer 3 is covered with a layer of oxide having a thickness of about 300 nm, which is etched away by means of an anistropic etching treatment in such a manner that spacers 34 are formed at the area of the gate electrodes 28 and 29. After a photoresist mask 35 has been provided, a source zone 36 and a drain zone 37 are formed by an implantation with arsenic ions having an energy of 50 keV and a dose of $10^{15}$ ions per cm$^2$.

After the photoresist 35 has been removed, an insulating layer 38 with contact holes 39 is provided in a usual manner. A metallization 40 is provided on the insulating oxide layer 38 and contacts the different semiconductor zones through the contact holes 39.

For forming the gate oxide 26, for annealing implanted zones for a getter treatment, and for carrying out a few oxidations not described further (to obtain a clean silicon surface, this surface is sometimes oxidized, after which the oxide is etched away, the wafer is heated during the whole process for not longer than 1 hour in all at about 950° C. It clearly appears from the foregoing that the formation of the field oxide 8 - which in connection with the formation of the retrograde wells 17 and 20 must be extra thick - provides the most important contribution to a temperature budget, which in this embodiment comprises a heat treatment for 4 hours in all at 1000° C. This temperature budget should be kept as low as possible because during the heat treatment of the wafer at about 1000° C. doping atoms diffuse from the base layer 4 into the epitaxial top layer 5 of the silicon wafer 2, as a result of which not only the usable - lightly doped - part of the top layer becomes smaller, but also the transition between the two layers 4 and 5 becomes less abrupt. For a satisfactory operation of MOS transistors having dimensions in the submicron range, it is of major importance that the transistion between the base layer 4 and the epitaxial top layer 5 is as abrupt as possible and that it lies as close as possible below the retrograde wells 17 and 20. With the aforementioned temperature budget comprising a heat treatment for 4 hours at 1000° C., the layer 4 diffuses less than 1 um into the epitaxial top layer 5.

It will be appreciated that the invention is not limited to the embodiment described, but that within the scope of the invention many variations are possible for those skilled in the art. For example, instead of an oxidation mask 3 consisting of a layer of silicon oxynitride 6 and a layer of silicon nitride 7, any desired other oxidation mask may be used, such as, for example, a mask whose base layer 6 consists of silicon oxide, while at the separation surface with the silicon a thin layer of nitride may be formed by nitridation. Further, an oxidation mask wholly consisting of silicon oxynitride may be used.

What is claimed is:

1. A method of manufacturing semiconductor devices having defect free areas below field oxide layers comprising the steps of
   forming an oxidation preventing mask locally on a surface of a silicon wafer, and
   oxidizing unmasked portions of said silicon wafer by carrying out in sequence the steps of
   heating said silicon wafer to a temperature range of 950° C. to 1050° C.,
   initially passing a wet oxidizing gas mixture over said silicon wafer in said temperature range to initially oxidize said unmasked portions of said silicon wafer to a thickness of up to at least 50 nm, said wet oxidizing gas mixture having a water content of at most 30% by volume to prevent defects from forming in the underlying silicon wafer,
   then adding additional water to said oxidizing gas mixture in said temperature range to bring said water content to an amount of more than 30% by volume, and
   continuing passing said oxidizing gas mixture with the added water over said silicon wafer until a desired thickness of oxide is formed on said silicon wafer.

2. A method according to claim 1, wherein said step of passing said oxidizing gas mixture is carried out to initially oxidize said silicon wafer to a thickness of 50 to 200 nm.

3. A method according to claim 1, wherein said step of adding water is carried out to bring said water content to more than 80% by volume.

4. A method according to claim 3, wherein said step of passing said oxidizing gas mixture is carried out to initially oxidize said silicon wafer to a thickness of 50 to 200 nm.

5. A method according to claim 1 or claim 3 or claim 4, wherein said step of adding water is carried out by reacting hydrogen and oxygen in the area of said silicon wafer.

6. A method according to claim 1 or claim 3 or claim 4, wherein said step of forming said oxidation preventing mask is carried out by depositing a base layer of silicon oxynitride having a refractive index of 1.6 to 1.8 and then depositing a top layer of silicon nitride on said base layer.

7. A method according to claim 6, wherein said base layer is deposited to a thickness of 30 to 50 nm, and said top layer is deposited to a thickness of 75 to 150 nm.

8. A method according to claim 7, wherein said desired thickness is approximately 800 nm.

9. A method according to claim 1 or claim 3 or claim 4, wherein said desired thickness is approximately 800 nm.

10. A method according to claim 1 or claim 3 or claim 4, wherein said step of initially passing a wet oxidizing gas mixture over said silicon wafer is carried out with said water content being about 15% by volume.

11. A method according to claim 10, wherein said step of initially passing a wet oxidizing gas mixture over said silicon wafer is carried out for about 20 minutes.

12. A method according to claim 11, wherein said desired thickness of oxide is 800 nm and is obtained in about 4 hours.

* * * * *